(12) United States Patent
Tsuji et al.

(10) Patent No.: US 7,833,882 B2
(45) Date of Patent: Nov. 16, 2010

(54) METHOD OF PRODUCING A SEMICONDUCTOR DEVICE BY FORMING AN OXIDE FILM ON A RESIN LAYER

(75) Inventors: Yukihiro Tsuji, Yokohama (JP); Toshio Nomaguchi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 124 days.

(21) Appl. No.: 11/651,534

(22) Filed: Jan. 10, 2007

(65) Prior Publication Data

US 2007/0187707 A1    Aug. 16, 2007

(30) Foreign Application Priority Data

Feb. 14, 2006    (JP) .......................... P2006-037134

(51) Int. Cl.
  *H01L 21/322* (2006.01)
  *H01L 21/469* (2006.01)
  *H01L 21/00* (2006.01)
(52) U.S. Cl. .................. 438/474; 438/475; 438/788; 438/798; 257/E29.111
(58) Field of Classification Search ......... 438/474–475, 438/788, 798; 257/E29.111
See application file for complete search history.

(56) References Cited

U.S. PATENT DOCUMENTS

| 5,208,067 | A | * | 5/1993 | Jones et al. | 427/97.3 |
| 5,260,603 | A | * | 11/1993 | Kamura et al. | 257/745 |
| 6,518,170 | B2 | * | 2/2003 | Koganei | 438/623 |
| 2001/0021088 | A1 | * | 9/2001 | Hoshino et al. | 360/320 |
| 2005/0199979 | A1 | * | 9/2005 | Shimoishizaka et al. | 257/528 |
| 2005/0239277 | A1 | * | 10/2005 | Mercer et al. | 438/614 |
| 2005/0253171 | A1 | * | 11/2005 | Kang et al. | 257/211 |
| 2006/0003256 | A1 | * | 1/2006 | Takahashi et al. | 430/270.1 |

FOREIGN PATENT DOCUMENTS

| JP | 06-120163 A | 4/1994 |
| JP | 08-264478 A | 10/1996 |
| JP | 2002-164622 | 6/2002 |
| JP | 2002-164622 A | 6/2002 |
| JP | 2003-347674 A | 5/2003 |
| JP | 2003-188475 A | 7/2003 |
| JP | 2004-014993 A | 1/2004 |
| JP | 2004-071713 A | 3/2004 |
| JP | 2004-128360 A | 4/2004 |
| JP | 2005-181416 A | 7/2005 |

OTHER PUBLICATIONS

Office Action from Japanese Patent Office for Patent Application No. P2006-037134 mailed Mar. 2, 2010. English Translation Enclosed.

* cited by examiner

*Primary Examiner*—Khiem D Nguyen
*Assistant Examiner*—Kevin Parendo
(74) *Attorney, Agent, or Firm*—Smith, Gambrell & Russell, LLP (57) ABSTRACT

A method of producing a semiconductor device, including: a first plasma processing step of processing a surface of a resin layer laid on a semiconductor element and containing silicon, with a first plasma generated from a gas containing oxygen and fluorine, thereby forming an oxide film; and an electrode pad forming step of forming an electrode pad of a metal on the oxide film.

7 Claims, 6 Drawing Sheets

METHOD OF PRODUCING A SEMICONDUCTOR DEVICE BY FORMING AN OXIDE FILM ON A RESIN LAYER

BACKGROUND OF THE INVENTION

1. Field of the Invention

The present invention relates to a semiconductor device and production method thereof.

2. Related Background Art

There is a known semiconductor laser in which a bonding pad is formed on a resin layer of benzocyclobutene (BCB) (e.g., cf. Japanese Patent Application Laid-Open No. 2002-164622).

SUMMARY OF THE INVENTION

An electrode pad such as the bonding pad is normally made of metal. Since adhesion is generally insufficient between metal and resin, the electrode pad is less likely to adhere to the resin layer. The insufficient adhesion between the electrode pad and the resin layer could cause the electrode pad to peel off the resin layer during wire bonding.

The present invention has been accomplished in view of the above circumstances and an object of the invention is to provide a semiconductor device and production method thereof improved in adhesion between the resin layer and the electrode pad.

In order to solve the above problem, a production method of a semiconductor device according to the present invention is a method comprising: a first plasma processing step of processing a surface of a resin layer laid on a semiconductor element and containing silicon, with a first plasma generated from a gas containing oxygen and fluorine, thereby forming an oxide film; and an electrode pad forming step of forming an electrode pad of a metal on the oxide film.

A semiconductor device according to the present invention is a device comprising: a semiconductor element; a resin layer laid on the semiconductor element and containing silicon; an oxide film laid on the resin layer and containing silicon; and an electrode pad laid on the oxide film and containing a metal.

DESCRIPTION OF THE PREFERRED EMBODIMENTS

Embodiments of the present invention will be described below in detail with reference to the accompanying drawings. In the description of the drawings identical or equivalent elements will be denoted by the same reference symbols, without redundant description.

First Embodiment

Figure 1:
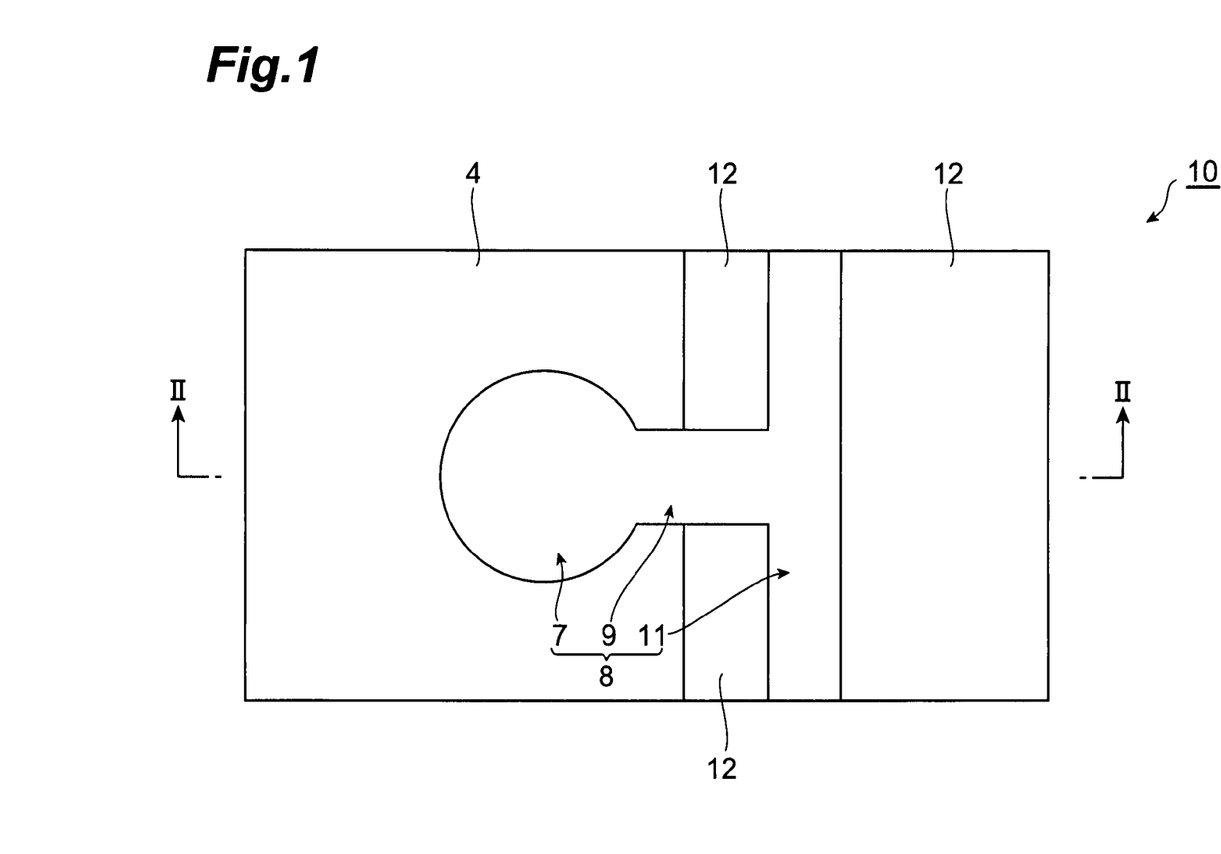
FIG. 1 is a plan view schematically showing a semiconductor device according to the first embodiment.
Figure 2:
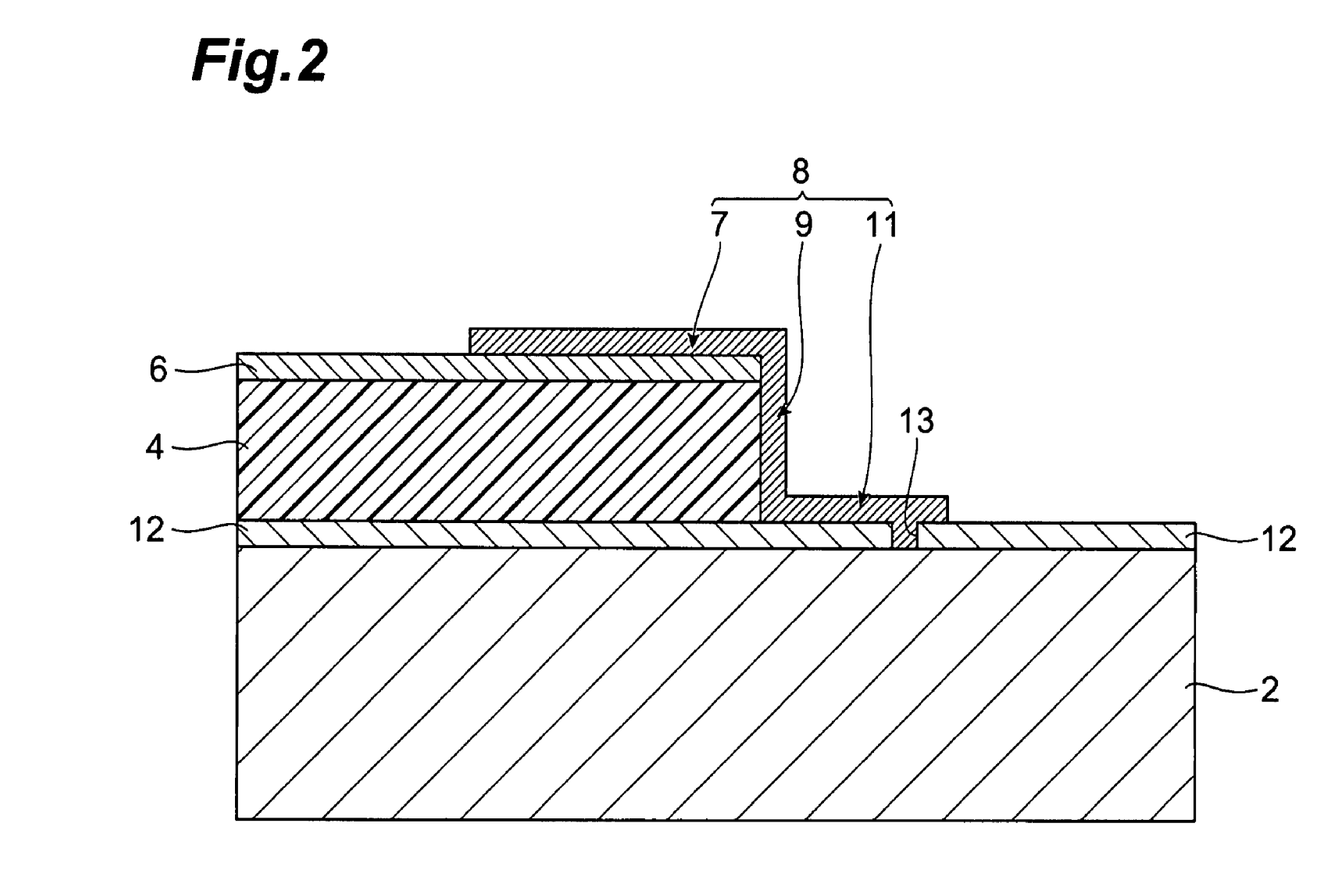
FIG. 2 is a sectional view along line II-II shown in FIG. 1.

FIG. 1 is a plan view schematically showing a semiconductor device according to the first embodiment. FIG. 2 is a sectional view along line II-II shown in FIG. 1. The semiconductor device 10 shown in FIGS. 1 and 2 comprises a semiconductor element 2, a resin layer 4 laid on the semiconductor element 2 and containing silicon (Si), an oxide film 6 laid on the resin layer 4 and containing silicon, and an electrode pad 8 laid on the oxide film 6 and containing a metal. The resin layer 4, oxide film 6, and electrode pad 8 are laid as adhering to each other.

Preferably, an insulating layer 12 is provided between the semiconductor element 2 and the resin layer 4. The insulating layer 12 is made, for example, of a silicon oxide such as $SiO_2$. An aperture 13 is formed in the insulating layer 12, and the electrode pad 8 is filled in the aperture 13. The aperture 13 is, for example, a channel extending in a predetermined direction.

The semiconductor element 2 is, for example, a semiconductor optical element, an electronic device, or the like. The semiconductor optical element is, for example, a semiconductor laser, a photodiode, an optical modulator, or the like. The electronic device is, for example, an LSI, a transistor, an IC (integrated circuit), or the like.

The resin layer 4 is made of a resin containing silicon. Since the resin containing silicon has good characteristics, e.g., low dielectric constant and high heat resistance, the resin layer 4 can reduce the capacitance (parasitic capacitance) of the semiconductor device 10. As a result, the semiconductor device 10 can operate at higher speed. Examples of the resin containing silicon include benzocyclobutenes (BCBs), carbosilane compounds, siloxane compounds, and so on. Among the benzocyclobutenes, a particularly preferred one is divinyltetramethyl siloxane-bis benzocyclobutene (DVS-bis-BCB).

The oxide film 6 is preferably one obtained by oxidizing the aforementioned resin containing silicon. The oxide film 6 is made, for example, of a silicon oxide. The thickness of the oxide film 6 is preferably 4-50 nm. If the thickness of the oxide film 6 is less than 4 nm, adhesion tends to be insufficient between the resin layer 4 and the electrode pad 8. On the other hand, if the thickness of the oxide film 6 exceeds 50 nm, the oxide film 6 tends to be likely to crack because of voids in the oxide film 6. The thickness of the oxide film 6 is, for example, 4-5 nm. The thickness of the oxide film 6 is measured, for example, with an XPS (X-ray photoelectron spectrometer) or the like.

The electrode pad 8 preferably has a pad portion 7, an electrode portion 11, and a connection portion 9 for connecting the pad portion 7 and the electrode portion 11. The pad portion 7 is preferably a planar member laid on the oxide film 6. The pad portion 7 functions as a bonding pad. In an example, the pad portion 7 has a disk shape with the diameter of 60 μm and the thickness of 3 μm. The electrode portion 11 is preferably filled in the aperture 13 of the insulating layer 12 and electrically connected to the semiconductor element 2. The electrode pad 8 is preferably made of titanium (Ti). More preferably, the electrode pad 8 has a three-layer structure of Ti/Pt/Au.

In the semiconductor device 10 of the present embodiment, since the resin layer 4 and the electrode pad 8 are connected by the oxide film 6, adhesion can be improved between the resin layer 4 and the electrode pad 8. Particularly, where the thickness of the oxide film 6 is 4-50 nm, adhesion can be improved between the resin layer 4 and the electrode pad 8. The adhesion between the resin layer 4 and the electrode pad 8 can be further improved by adjusting the surface roughness Ra or modulus of elasticity of the oxide film 6.

When the electrode pad 8 is made of titanium, the adhesion between the resin layer 4 and the electrode pad 8 can be further improved, for example, in comparison with the electrode pad 8 made of gold, platinum, or the like. Furthermore, when the semiconductor element 2 is a semiconductor optical element, the resin layer 4 has a lower capacitance, for example, than an inorganic layer or the like, and thus the semiconductor optical element can operate at higher speed.

FIGS. 3A to 3C and FIGS. 4A to 4C are sectional step diagrams schematically showing a production method of the semiconductor device according to the first embodiment. A production method of semiconductor device 10 will be described below as an example.

(First Plasma Processing Step)

Figure 3A:
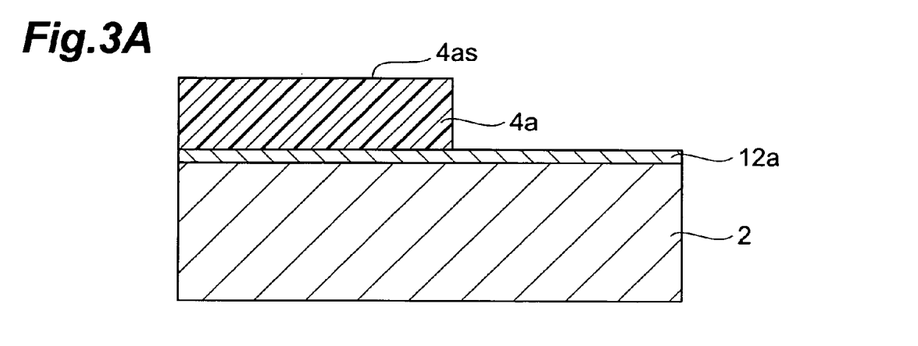
FIGS. 3A to 3C are sectional step diagrams schematically showing a production method of the semiconductor device according to the first embodiment.

As shown in FIG. 3A, a resin layer 4a containing silicon is formed on a semiconductor element 2. Preferably, the resin layer 4a is formed after an insulating layer 12a is formed on the semiconductor element 2. The resin layer 4a is obtained, for example, by coating with a resin containing silicon.

In an example, the surface roughness Ra of a surface 4 as of the resin layer 4a is 2.37 Å. In the present specification, the surface roughness Ra is calculated from an image acquired, for example, with an atomic force microscope (AFM). In an example, the content of carbon in the surface part (in the thickness of 4-5 nm) of the resin layer 4a is approximately 88 atomic %, the content of oxygen approximately 5.1 atomic %, the content of silicon approximately 7.2 atomic %, and the content of fluorine 0 atomic %. In the present specification, the contents of atoms are measured, for example, by X-ray photoelectron spectrometry (XPS).

Figure 3B:
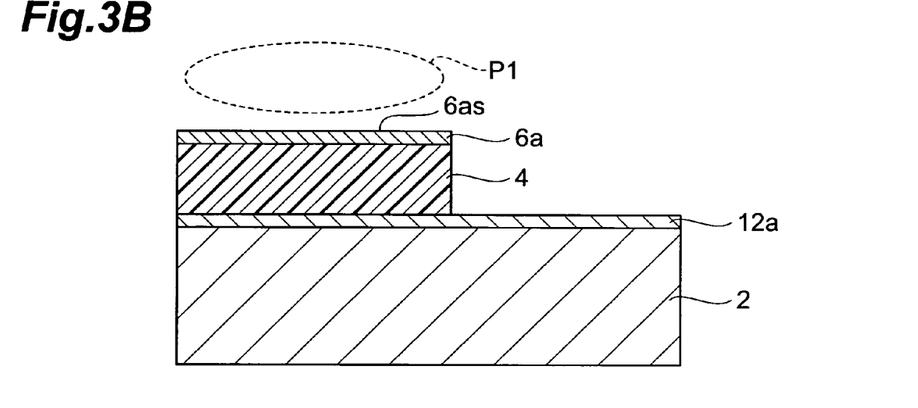

Subsequently, the surface 4 as of the resin layer 4a is processed with a first plasma P1 generated from a gas mixture of a gas containing oxygen (O) and a gas containing fluorine (F), as shown in FIG. 3B. The gas containing oxygen is preferably $O_2$ gas. The gas containing fluorine is preferably $CF_4$ gas.

The preferred conditions for generation of the plasma P1 are as follows: pressure 0.01-1 Torr (1 Torr=133.322 Pa); power 50-100 W; mixed gas ratio $O_2:CF_4$=1:1 to 2:1. In an example, the pressure is 0.5 Torr, the power 52 W, and the mixed gas ratio $O_2:CF_4$=5:4.

In the first plasma processing step the surface 4 as of the resin layer 4a is oxidized by oxygen in the plasma P1 and etched by fluorine in the plasma P1. This results in forming an oxide film 6a in a desired thickness (e.g., 4-5 nm). An oxidized portion in the resin layer 4a becomes the oxide film 6a, and an unoxidized portion the resin layer 4.

In an example, the surface roughness Ra of a surface 6s of the oxide film 6a is 10.83 Å. In an example, the content of carbon in the oxide film 6a is approximately 51 atomic %, the content of oxygen approximately 35 atomic %, the content of silicon approximately 12.7 atomic %, and the content of fluorine approximately 2.2 atomic %. It is apparent from this example that the process with the plasma P1 decreases the content of carbon and increases the contents of oxygen and silicon.

(Second Plasma Processing Step)

Figure 3C:
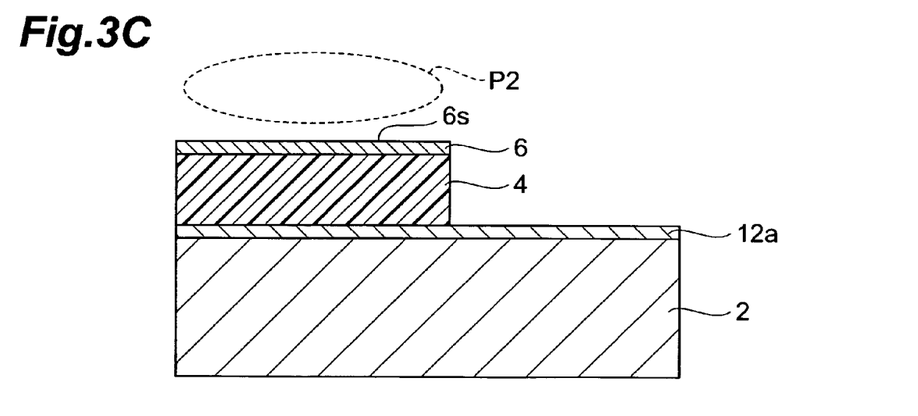

Subsequently, the surface 6 as of the oxide film 6a is preferably processed with a second plasma P2 generated from an inert gas, as shown in FIG. 3C. The inert gas is for example, nitrogen gas, noble gas, or the like. The noble gas is preferably, for example, He gas, Ne gas, or Ar gas. In an example, the inert gas is nitrogen gas.

The preferred conditions for generation of the plasma P2 are as follows: pressure $1\times10^{-6}$–0.1 Torr; power 50-100 W. In an example, the pressure is 0.04 Torr and the power 52 W.

The second plasma processing step decomposes and removes fluorine compounds and organic substances in the oxide film 6a to form an oxide film 6 from the oxide film 6a.

In an example, the surface roughness Ra of a surface 6s of the oxide film 6 is 14.04 Å. In an example, the content of carbon in the oxide film 6 is approximately 25 atomic %, the content of oxygen approximately 50 atomic %, the content of silicon approximately 19.6 atomic %, and the content of fluorine 0 atomic %. It is apparent from this example that the process with the plasma P2 further decreases the content of carbon and further increases the contents of oxygen and silicon. In addition, it is seen that the content of fluorine also decreases.

(Electrode Pad Forming Step)

Subsequently, an electrode pad 8 of metal is formed on the oxide film 6, as shown in FIGS. 1, 2, and 4A to 4C. The electrode pad 8 is formed, for example, in a manner as described below by the lift-off method.

Figure 4A:
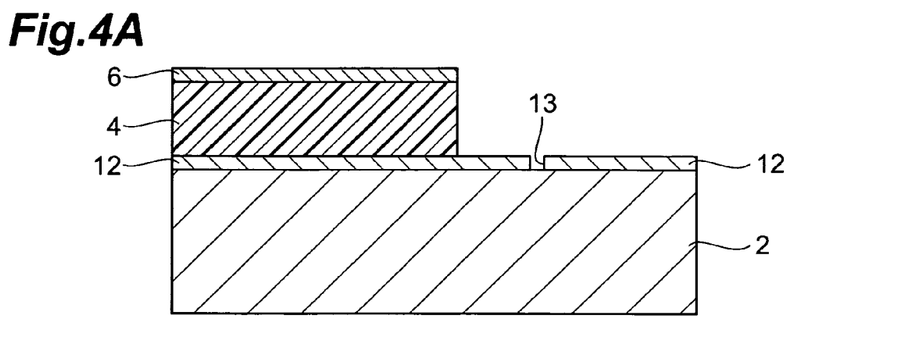
FIGS. 4A to 4C are sectional step diagrams schematically showing the production method of the semiconductor device according to the first embodiment.

First, if necessary, the insulating layer 12a is etched, for example, by photolithography to obtain the insulating layer 12 with an aperture 13, as shown in FIG. 4A.

Figure 4B:
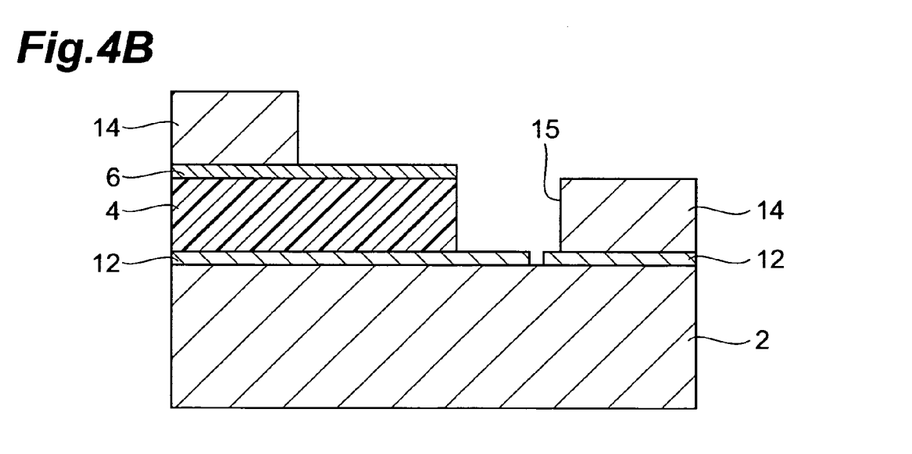

Next, as shown in FIG. 4B, a resist 14 with an aperture 15 is formed on the oxide film 6 and on the insulating layer 12, for example, by photolithography. The aperture 15 is preferably formed so as to expose the aperture 13.

Figure 4C:
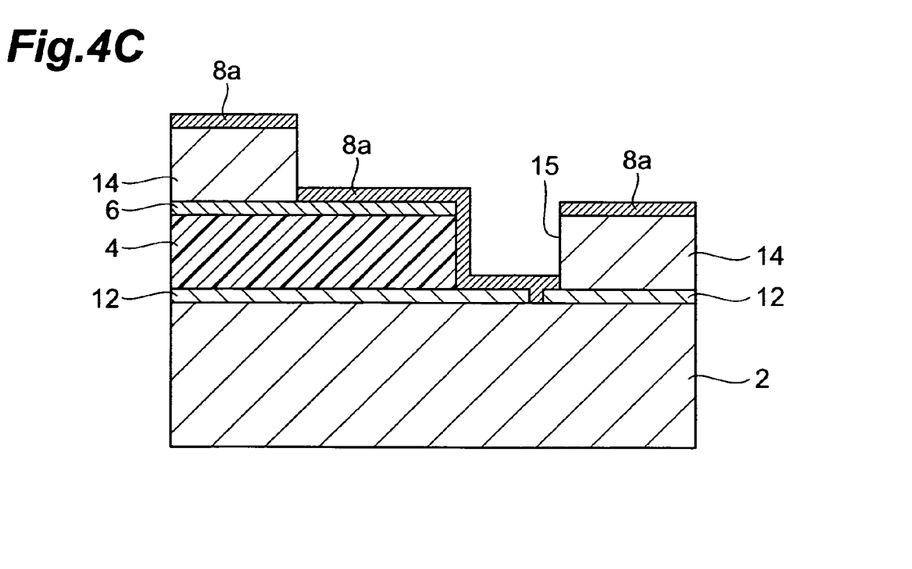

Next, as shown in FIG. 4C, a metal film 8a is evaporated over the entire surface on the resist 14 and on the semiconductor element 2. Thereafter, the resist 14 is stripped off to obtain the electrode pad 8 from the metal film 8a. After the formation of the electrode pad 8, it is preferable to perform bonding with a wire for mounting on the electrode pad 8. The wire is, for example, of gold and is preferably bonded by ultrasonic wave or by thermal compression. The diameter of the wire is, for example, 100 μm.

The semiconductor device 10 shown in FIGS. 1 and 2 is produced through each of the above-described steps.

In the production method of the semiconductor device of the present embodiment, the surface 4 as of the resin layer 4a is oxidized by oxygen in the plasma P1 and etched by fluorine in the plasma P1. As a result, the oxide film 6a in the desired thickness (e.g., 4-5 nm) is formed in the surface portion of the resin layer 4a. When the oxide film 6a is formed in this manner, adhesion can be enhanced between the resin layer 4 and the electrode pad 8. Since the production method of the semiconductor device of the present embodiment is rarely dependent upon a plasma processing chamber or discharge stability, it is easy to uniformize the thickness of the oxide film 6a. In a case where the surface 4 as of the resin layer 4a is processed with a plasma generated from only oxygen gas, the thickness of the oxide film formed in the surface portion of the resin layer 4a is normally too thick and it is thus difficult to achieve the aforementioned desired thickness. In addition, the surface 4 as of the resin layer 4a tends to crack and get rough.

Furthermore, the execution of the second plasma processing process can decompose and remove fluorine compounds and organic substances in the oxide film 6a. This results in forming the oxide film 6 having the high oxygen content and silicon content and comprised essentially of inorganic ingredients. When the oxide film 6 is formed in this manner, adhesion can be further enhanced between the resin layer 4 and the electrode pad 8.

When the electrode pad 8 is made of titanium, the adhesion can be more enhanced between the resin layer 4 and the electrode pad 8, for example, than when the electrode pad 8 is made of gold, platinum, or the like. Furthermore, when the semiconductor element 2 is a semiconductor optical element, the resin layer 4 has a lower capacitance, for example, than inorganic layers or the like, and thus the semiconductor optical element can operate at higher speed.

Second Embodiment

Figure 5:
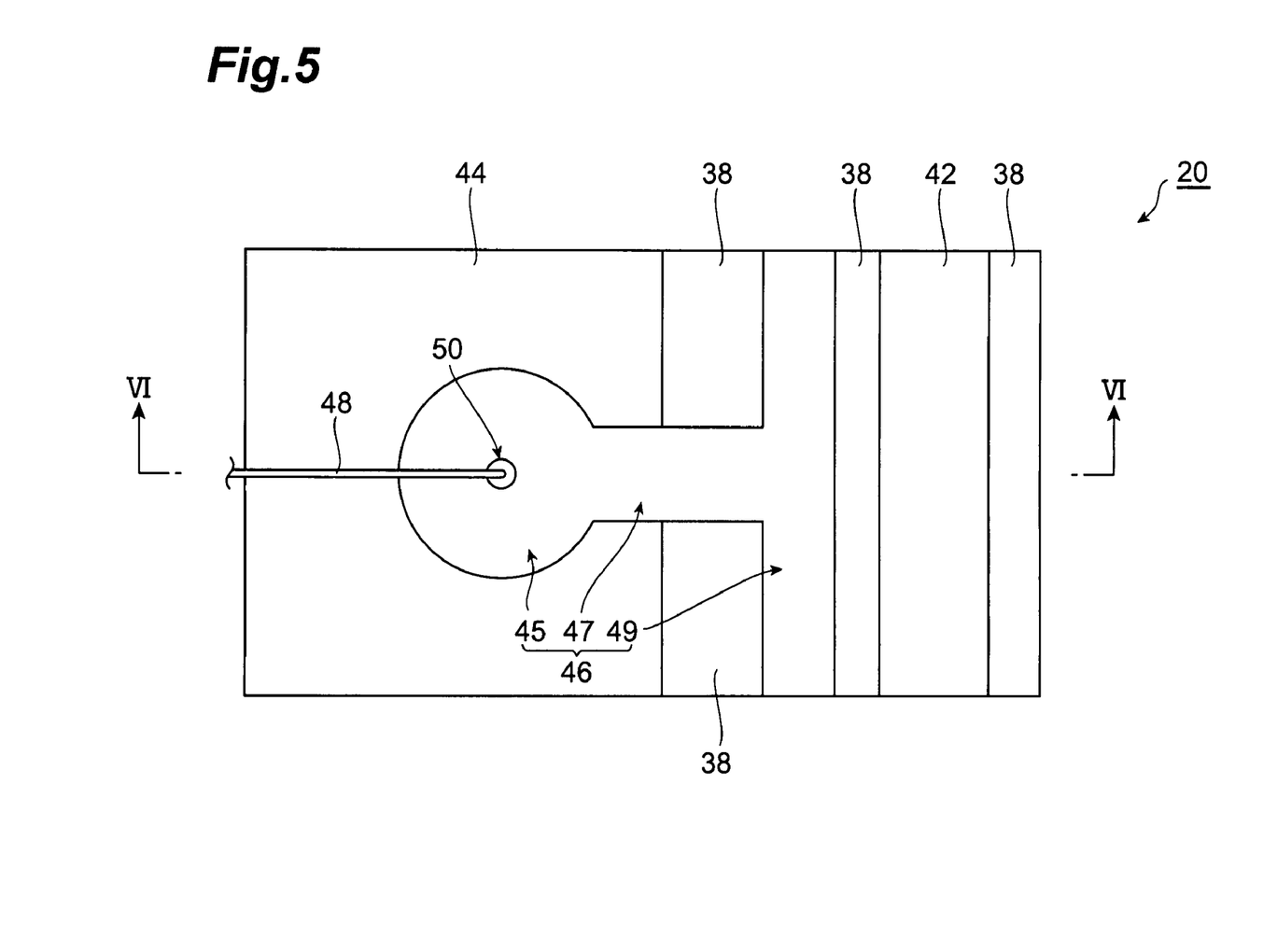
FIG. 5 is a plan view schematically showing a semiconductor device according to the second embodiment.
Figure 6:
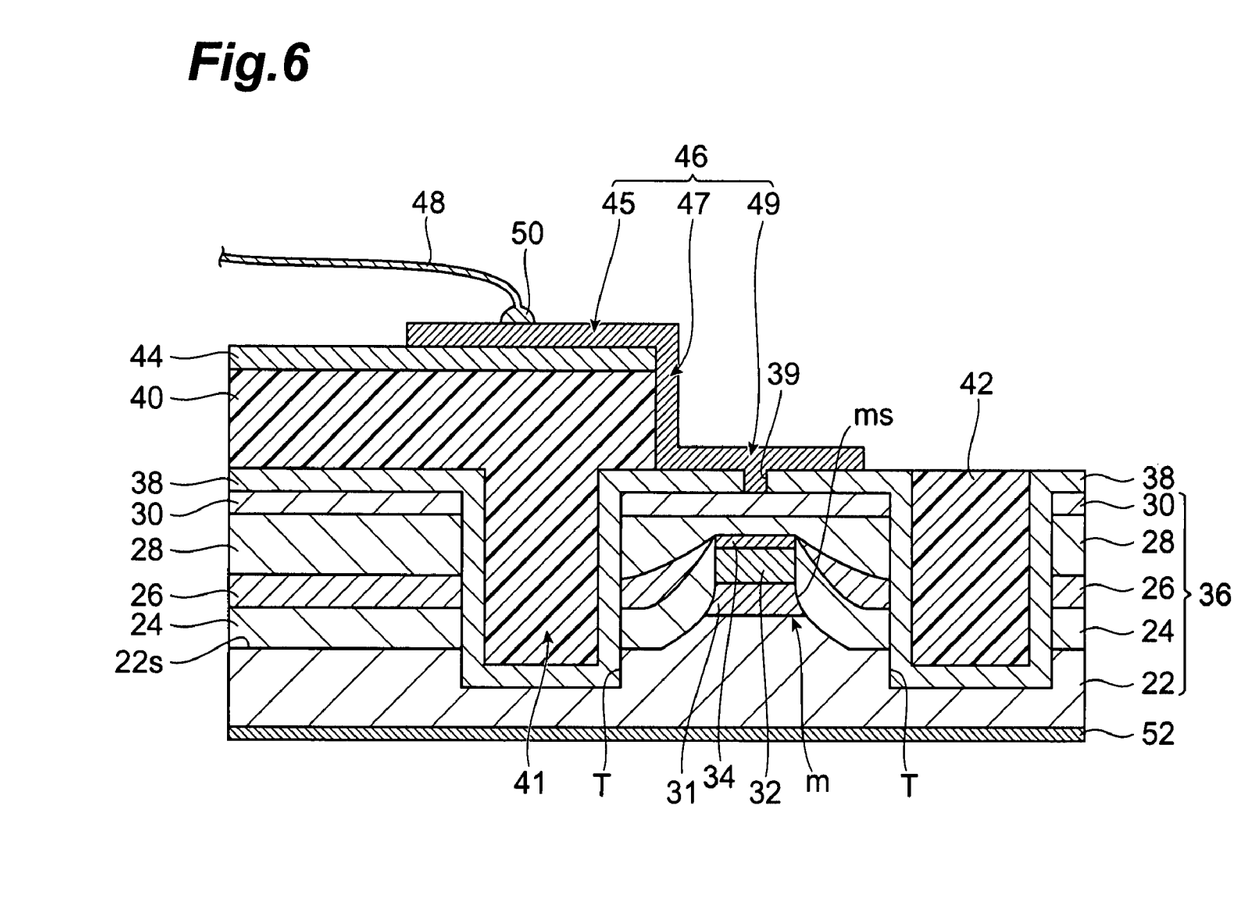
FIG. 6 is a sectional view along line VI-VI shown in FIG. 5.

FIG. 5 is a plan view schematically showing a semiconductor device according to the second embodiment. FIG. 6 is a sectional view along line VI-VI shown in FIG. 5. The semiconductor device 20 shown in FIGS. 5 and 6 comprises a semiconductor laser 36 comprised essentially of a III-V compound semiconductor, a resin layer 40 laid on the semiconductor laser 36 and containing silicon, an oxide film 44 laid on the resin layer 40 and containing silicon, and an electrode pad 46 laid on the oxide film 44 and containing a metal. The resin layer 40, oxide film 44, and electrode pad 46 are laid as adhering to each other. The resin layer 40, oxide film 44, and electrode pad 46 are comprised of their respective materials similar to those of the resin layer 4, oxide film 6, and electrode pad 8, respectively. The oxide film 44 and electrode pad 46 have their respective shapes similar to those of the oxide film 6 and electrode pad 8, respectively.

The semiconductor laser 36 is located, for example, between the electrode pad 46 and an electrode 52. When a voltage is applied between the electrode pad 46 and the electrode 52, the semiconductor laser 36 emits light. The semiconductor laser 36 has a semiconductor substrate 22 electrically connected to the electrode 52, and a mesa part m laid on the semiconductor substrate 22 and including an active layer 32. The semiconductor substrate 22 is comprised, for example, of InP of a first conductivity type. The first conductivity type is, for example, the n-type. The active layer 32 preferably has the multiple quantum well structure. The active layer 32 is comprised, for example, of GaInAsP or AlGaInAs.

The mesa part m has a cladding layer 31 of the first conductivity type located between the semiconductor substrate 22 and the active layer 32, and a cladding layer 34 of a second conductivity type laid on the active layer 32. The second conductivity type is, for example, the p-type. Buried layer 24 and buried layer 26 are provided in the order named, on a side face ms of the mesa part m and on a principal surface 22s of the semiconductor substrate 22. The buried layer 24 is comprised, for example, of InP of the second conductivity type. The buried layer 26 is comprised, for example, of InP of the first conductivity type.

A cladding layer 28 of the second conductivity type is provided on the cladding layer 34 and on the buried layer 26. A contact layer 30 electrically connected to the electrode pad 46 is provided on the cladding layer 28. The contact layer 30 is comprised, for example, of InGaAs of the second conductivity type.

Trenches T, T penetrating from the contact layer 30 to the semiconductor substrate 22 are preferably formed in the semiconductor laser 36. The mesa part m is located between the trenches T, T. Furthermore, an insulating layer 38 is preferably provided along the trenches T, T between the semiconductor laser 36 and the resin layer 40. The insulating layer 38 is comprised, for example, of a silicon oxide such as $SiO_2$. An aperture 39 located above the mesa part m is formed in the insulating layer 38 and the electrode pad 46 is filled in the aperture 39. The aperture 39 is, for example, a channel extending in a predetermined direction.

The resin layer 40 is laid on one trench T. The resin layer 40 has a resin portion 41 filled in the one trench T. A resin portion 42 is filled in the other trench T. The resin portion 42 is comprised of a material similar to the resin layer 4.

The electrode pad 46 preferably has a pad portion 45, an electrode portion 49, and a connection portion 47 for connecting the pad portion 45 and the electrode portion 49. The pad portion 45 is located on the resin layer 40. The electrode portion 49 is filled in the aperture 39 and electrically connected to the contact layer 30. A terminal 50 of a wire 48 is electrically connected to the pad portion 45.

In the semiconductor device 20 of the present embodiment, as in the first embodiment, the oxide film 44 connects the resin layer 40 and the electrode pad 46, and thus the adhesion can be enhanced between the resin layer 40 and the electrode pad 46. The semiconductor device 20 is produced by a method similar to that of the semiconductor device 10.

The preferred embodiments of the present invention were described above in detail, but it is noted that the present invention is by no means limited to the above embodiments.

As described above, the present invention provides the semiconductor device and production method thereof improved in adhesion between the resin layer and the electrode pad.

What is claimed is:

1. A method of producing a semiconductor device, comprising the steps of:
    forming an insulating layer on a semiconductor element;
    then, forming a resin layer on the insulating layer, the resin layer containing silicon;
    applying a first plasma to a surface of the resin layer, the first plasma being generated by a gas mixture containing oxygen and fluorine, thus forming an oxide film with a predetermined thickness greater than or equal to 4 nm and less than or equal to 50 nm on the resin layer, the surface being both oxidized and etched concurrently by the first plasma;
    then, forming an aperture in the insulating layer; and
    forming an electrode pad composed of a metal directly on the oxide film, on the insulating layer, and in the aperture to electrically connect the electrode pad to the semiconductor element.

2. The method according to claim 1, further comprising:
    exposing a surface of the oxide film to a second plasma generated by an inert gas after forming the oxide film on the resin layer.

3. The method according to claim 2, wherein the inert gas comprises a nitrogen gas or a noble gas.

4. The method according to claim 1, wherein the electrode pad is comprised of titanium.

5. The method according to claim 1, wherein the semiconductor element is a semiconductor optical element.

6. The method according to claim 1, wherein the gas mixture comprises a mixed gas ratio of $O_2:CF_4$ ranging from 1:1 to 2:1.

7. A method of producing a semiconductor device comprising the steps of:
    forming a semiconductor laminate on a semiconductor substrate to form a semiconductor element, the semiconductor laminate having an active layer and a contact layer formed on the active layer;
    forming an insulating layer on the semiconductor element;

forming a resin layer containing silicon on the insulting layer;

applying a first plasma to a surface of the resin layer, the first plasma being generated by a gas mixture of $O_2$ and $CF_4$, thus forming an oxide film with a predetermined thickness greater than or equal to 4 nm and less than or equal to 50 nm on the resin layer, the surface being both oxidized and etched concurrently by the first plasma;

forming an aperture for an electrode pad in the insulating layer; and forming the electrode pad on the oxide film, on the insulating layer and in the aperture, wherein the electrode pad on the insulating layer is electrically connected to the contact layer in the semiconductor laminate via the aperture.

* * * * *